US008742785B2

(12) United States Patent
Weng et al.

(10) Patent No.: US 8,742,785 B2
(45) Date of Patent: Jun. 3, 2014

(54) DRIVING METHOD AND METHOD FOR MEASURING FEED THROUGH VOLTAGE OF ELECTROPHORETIC DISPLAY

(75) Inventors: Ming-Chi Weng, Kinmen County (TW); Yun-Chih Chen, Taoyuan County (TW); Hung-Hsiang Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 342 days.

(21) Appl. No.: 13/174,805

(22) Filed: Jul. 1, 2011

(65) Prior Publication Data

US 2012/0194166 A1 Aug. 2, 2012

(30) Foreign Application Priority Data

Jan. 28, 2011 (TW) ............................. 100103473 A

(51) Int. Cl.
*G01R 31/26* (2014.01)

(52) U.S. Cl.
USPC ........................................ 324/760.01; 345/55

(58) Field of Classification Search
USPC .................................................... 324/760.01
See application file for complete search history.

(56) References Cited

U.S. PATENT DOCUMENTS

| | | | | |
|---|---|---|---|---|
| 8,111,447 | B2 * | 2/2012 | Fairly et al. | 359/296 |
| 8,228,274 | B2 * | 7/2012 | Chung et al. | 345/87 |
| 2008/0224983 | A1 | 9/2008 | Lee et al. | |
| 2009/0109389 | A1 | 4/2009 | Chen et al. | |

OTHER PUBLICATIONS

"Office Action of China Counterpart Application", issued on Jan. 5, 2013, p. 1-p. 6, in which the listed references were cited.
"Office Action of Taiwan counterpart application" issued on Oct. 16, 2013, p. 1-p. 6, in which the listed reference was cited.

* cited by examiner

*Primary Examiner* — Arleen M Vazquez
*Assistant Examiner* — Feba Pothen
(74) *Attorney, Agent, or Firm* — Jianq Chyun IP Office

(57) ABSTRACT

A driving method of an electrophoretic display is provided. The driving method includes the following steps. A plurality of pixels of a display panel of the electrophoretic display are configured as a plurality of blocks. A common voltage of the display panel is set to a first voltage. A plurality of scanning signals are inputted to a plurality of scanning lines of the display panel in order in which scanning lines corresponding to the same block receives the same scanning signal. A plurality of data lines of the display panel are measured to obtain at least one peak voltage corresponding to each of the blocks. A feed through voltage corresponding to each of the blocks is determined according the peak voltages corresponding to the blocks. A plurality of driving signals which drive each of the blocks are adjusted according the feed through voltage corresponding to each of the blocks.

12 Claims, 4 Drawing Sheets

DRIVING METHOD AND METHOD FOR MEASURING FEED THROUGH VOLTAGE OF ELECTROPHORETIC DISPLAY

CROSS-REFERENCE TO RELATED APPLICATION

This application claims the priority benefit of Taiwan application serial No. 100103473, filed on Jan. 28, 2011. The entirety of the above-mentioned patent applications is hereby incorporated by reference herein and made a part of this specification.

BACKGROUND OF THE INVENTION

1. Technical Field

The invention relates to a driving method and voltage measuring method, and particularly, relates to a driving method and feed through voltage measuring method of an electrophoretic display.

2. Description of Related Art

An electrophoretic display (EPD) has characteristics of light, thin, flexible and power-saving, and it is more suitable for promoted environmental protection issue recently, therefore, it becomes a popular display technique. Driving method of the electrophoreic display is using external electric field to change the positions of charged particles. Between charged particle and electrophoretic liquor, between charged particle and back board or between multiple charged particles presents the color contrast so as to display images and reduce thickness of displays due to without a backlight module. Moreover, the charged particle can be kept at the original position without using the external electric field, and the electrophoreic display can display the original frame so as to achieve power saving.

It usually uses TFT (Thin Film Transistor, TFT) substrate to produce AMEPD (Active-Matrix Electrophoretic Display) to raise the resolution of the electrophoretic display. A gate driver outputs scanning signals in order to multiple scanning lines of the display panel so as to turn on the pixel of each row by rows. The data lines is inputted a corresponding driving signal respectively so that drives the charged particle to change the position, in which the charged particle is driven through the electric field between the pixel electrode and the common electrode. For TFT substrate, when pixels of the display panel turns on by rows, the TFT drain voltage of each pixel (equals the voltage of the pixel electrode) is not stable. Namely, the voltage of the pixel electrode has a voltage difference from the pixel turned on to turned off. The voltage difference is due to a parasitic capacitance between the gate and the drain of the TFT, and the voltage difference is generally named feed through voltage.

In summary, for the active-matrix electrophoretic display produced by TFT substrate, it is similarity generated the parasitic capacitance between the gate and the drain of the TFT so that the pixel electrode voltage of each pixel decreases a feed through voltage when the pixel is turned off. Due to the electrophoretic display drives the charged particle through the electric field between the pixel electrode and the common electrode (the voltage difference between the pixel electrode and the common electrode), and the decrease of pixel electrode voltage affects the moving quality of the charged particle so as to affect the frame quality.

Moreover, since a liquid crystal display is similarly produced by TFT substrate, the liquid crystal display also has the problems of the feed through voltage. The liquid crystal display recovers the initial state automatically after stopping driving, so the feed through voltage of the liquid crystal display can be found through the frame flicker level. But, charged particles within the electrophoretic liquor will keep at the driving state after stopping driving so that the feed through voltage of the electrophoretic display can't be found through the frame flicker level.

SUMMARY OF THE INVENTION

The invention proposes a feed through voltage measuring method of an electrophoretic display. The method inputs a plurality of scanning signals to a plurality of scanning lines of a display panel, and determines a feed through voltage corresponding to each block of the display panel according to peak voltages measured through data lines.

The invention proposes a driving method of an electrophoretic display. The method adjusts waveforms of a plurality of driving signals corresponding to each block according to a feed through voltage corresponding to each block so as to compensate the feed through voltage.

An aspect of the invention provides a driving method of an electrophoretic display. The method includes following steps: configuring a plurality of pixels of a display panel of the electrophoretic display as a plurality of blocks, setting a common voltage of the display panel to a first voltage, inputting a plurality of scanning signals to a plurality of scanning lines of the display panel in order in which the scanning lines corresponding to the same block receives the same scanning signal, measuring a plurality of data lines of the display panel to obtain at least one peak voltage corresponding to each of the blocks, determining a feed through voltage corresponding to each of the blocks according to the peak voltages respectively corresponding to the blocks, adjusting a plurality of driving signals corresponding to each of the blocks according to the feed through voltage corresponding to each of the blocks, and driving each of the blocks respectively according to the adjusted driving signals.

According to an embodiment of the invention, the steps to adjust the driving signals corresponding to each of the blocks according the feed through voltage corresponding to each of the blocks includes forming a compensation pulse at each of the driving signals, in which pulse width of the compensation pulse is proportional to the feed through voltage.

According to an embodiment of the invention, the compensation pulse is formed before a data writing pulse of each of the driving signals.

According to an embodiment of the invention, the compensation pulse is formed after a data writing pulse of each of the driving signals.

According to an embodiment of the invention, the steps to adjust the driving signals corresponding to each of the blocks according the feed through voltage corresponding to each of the blocks includes shifting voltage levels of the driving signals, in which voltage level offsets of the driving signals equals the feed through voltage.

According to an embodiment of the invention, the feed through voltage corresponding to each of the blocks is an average value of the peak voltages corresponding to each of the blocks.

According to an embodiment of the invention, the feed through voltage corresponding to each of the blocks is an average value of the peak voltages corresponding to the blocks.

An aspect of the invention provides a feed through voltage measuring method of an electrophoretic display. The method includes the following steps: configuring a plurality of pixels of a display panel of the electrophoretic display as a plurality of blocks, setting a common voltage of the display panel as a first voltage, inputting a plurality of scanning signals to a plurality of scanning lines of the display panel in order in which the scanning lines corresponding to the same block receives the same scanning signal, measuring a plurality of data lines of the display panel to obtain at least one peak voltage corresponding to each of the blocks, and determining a feed through voltage corresponding to each of the blocks according to the peak voltages respectively corresponding to the blocks.

According to an embodiment of the invention, the blocks respectively comprises at least a pixel.

According to an embodiment of the invention, the first voltage is ground voltage.

In summary, the driving method and the feed through voltage measuring method according to embodiments of the invention configure the display panel as a plurality of blocks in which pixels of the same block be turned on according to the same scanning signal, and get a peak voltages corresponding to each of the blocks by measuring data lines. Next, the feed through voltage corresponding to each of the blocks can be determined according to the peak voltages corresponding to the blocks. The driving method adjusts the waveform of a plurality of driving signals corresponding to each of the blocks according to the feed through voltage corresponding to each of the blocks. Therefore, the feed through voltage corresponding to each of the blocks can be measured, and adjusts the waveforms of the driving signals corresponding to each of the blocks according the feed through voltage so as to compensate the feed through voltage.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EXEMPLARY EMBODIMENTS

Figure 1:
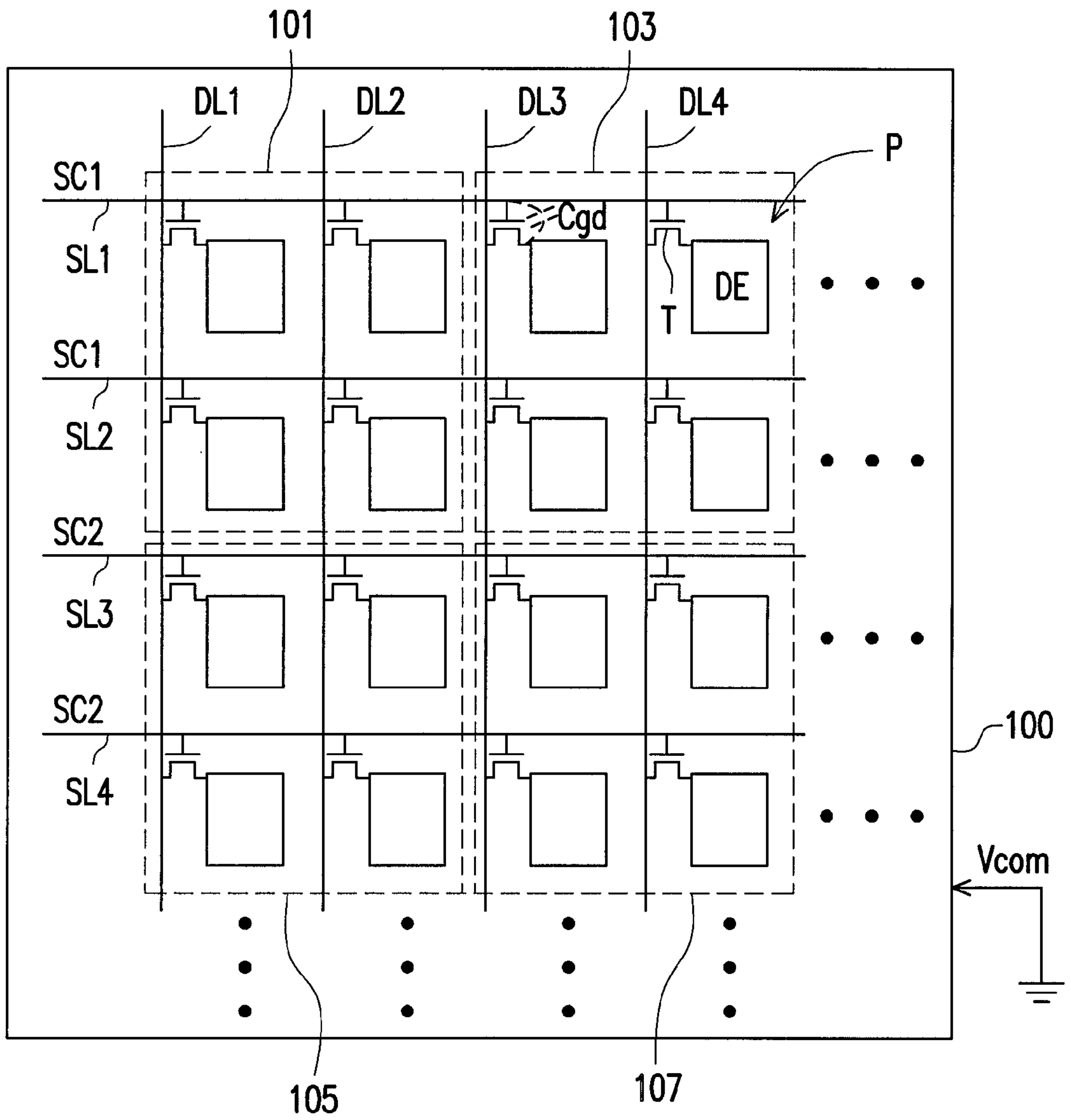
FIG. 1 is a block distribution schematic diagram of a display panel of an electrophoretic display according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a block distribution schematic diagram of a display panel of an electrophoretic display according to an embodiment of the invention. Referring to FIG. 1, in the embodiment, a display panel 100 includes a plurality of pixels P, a plurality of scanning lines (as SL1~SL4) and a plurality of data lines(as DL1~DL4). Each pixel at least includes a active element (transistor T as an example herein) and a display element DE, and display element includes elements are configured to display, for example, charged particle, electrophoretic liquor, pixel electrode and common electrode. However, the invention should not be construed as limited herein. In the embodiment, a common voltage Vcom received by the common electrode is coupled to a ground, namely sets the common voltage Vcom to a ground voltage (as a first voltage). But in other embodiments, the common voltage Vcom can be set to a direct current voltage. However, the invention should not be construed as limited herein.

Moreover, a plurality of pixels P of the display panel 100 can be configured to a plurality of blocks (as 101, 103, 105, and 107) so as to measure a peak voltages corresponding to each of the blocks. It defines the pixels P of 2*2 matrix arrangement as a block in the embodiments, but in other embodiments, it defines a pixel P as a block, or defines a plurality of pixels of any matrix arrangement as a block, namely a block at least includes a pixel P. To measure the peak voltages corresponding to each of the blocks, the scanning lines correspond to the same block receive the same scanning signal, for example, scanning lines SL1 and SL2 receive the scanning signal SC1, and the scanning lines SL3 and SL4 receives scanning signal SC2.

Figure 2:
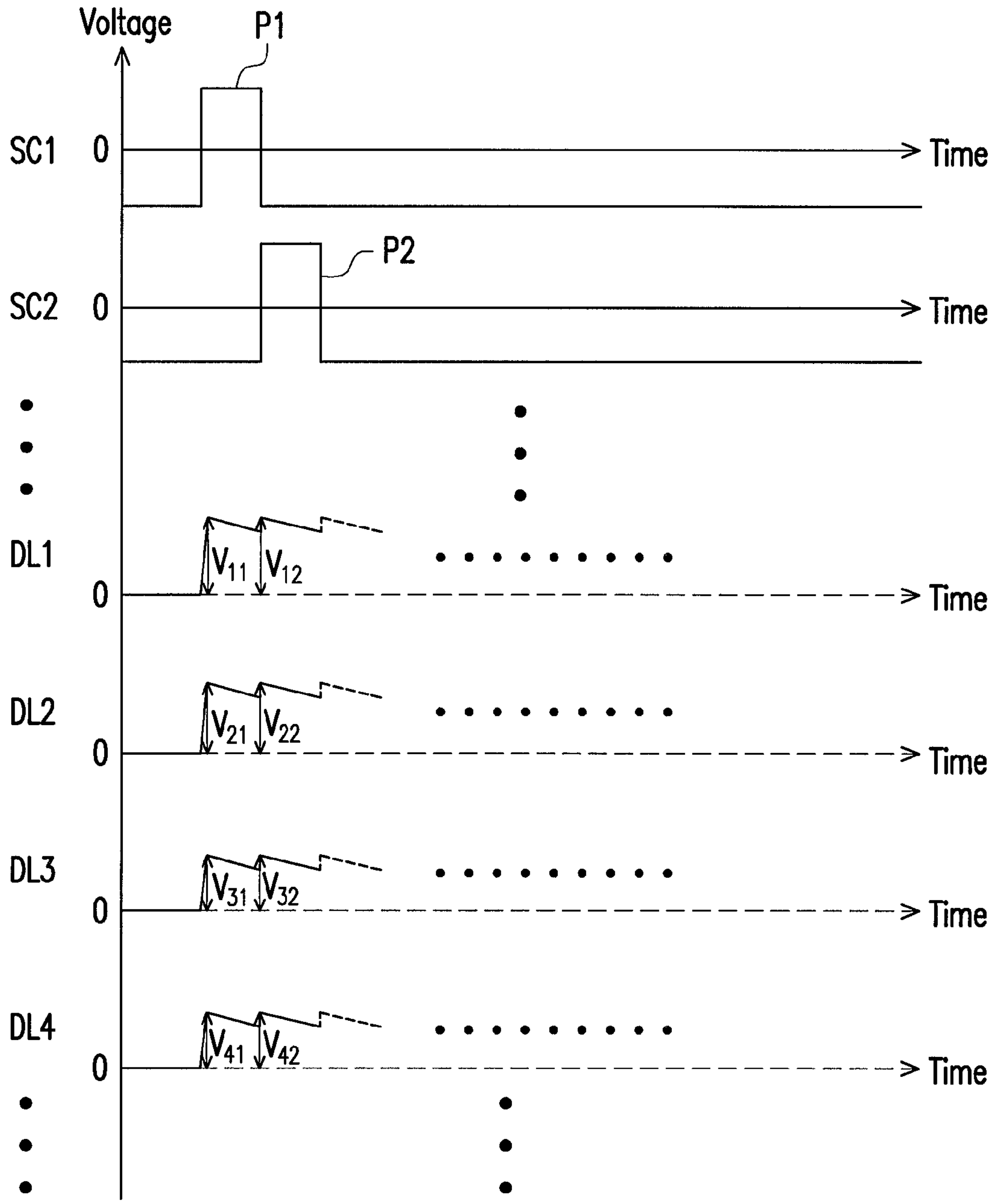
FIG. 2 is a waveform schematic diagram of scan signals and voltage of data lines depicted in FIG. 1 according to an embodiment of the invention.

FIG. 2 is a waveform schematic diagram of scan signals and voltage of data lines depicted in FIG. 1 according to an embodiment of the invention. Referring to FIG 1 and FIG. 2, in the embodiment, take the blocks 101, 103, 105, and 107 as examples. According to above description, the scanning signal SC1 is first inputted to the scanning line SL1 and SL2, and then the scanning signal SC2 is inputted to SL3 and SL4. Namely, the scanning signal SC1 forms the pulse P1 first, and then the scanning signal forms the pulse P2.

Transistors T of each pixel of the block 101 and 103 will be turned on when scanning signal SC1 forms the pulse P1. Meanwhile, in block 101 and 103, an equivalent capacitance Cgd between a gate and a drain of the transistor T is charged by the pulse P1, and the source and the drain of the transistor T are electrically connected so as to voltages of the source and the drain of the transistor T are the same. Therefore, the peak voltage of V11 of the drain voltage of the transistor T coupled to the data line DL1 in the block 101 can be measured via the data line DL1. The peak voltage of V21 of the drain voltage of the transistor T coupled to the data line DL2 in the block 101 can be measured via the data line DL2. The peak voltage of V31 of the drain voltage of the transistor T coupled to the data line DL3 in the block 103 can be measured via the data line DL3. The peak voltage of V41 of the drain voltage of the transistor T coupled to the data line DL4 in the block 103 can be measured via the data line DL4.

Transistors T of each pixel of the block 105 and 107 will be turned on when scanning signal SC2 forms the pulse P2. Meanwhile, in block 105 and 107, an equivalent capacitance Cgd between a gate and a drain of the transistor T is charged by the pulse P2. In addition, the peak voltage of V12 of the drain voltage of the transistor T coupled to the data line DL1 in the block 105 can be measured via the data line DL1. The peak voltage of V22 of the drain voltage of the transistor T coupled to the data line DL2 in the block 105 can be measured via the data line DL2. The peak voltage of V32 of the drain voltage of the transistor T coupled to the data line DL3 in the block 107 can be measured via the data line DL3. The peak voltage of V42 of the drain voltage of the transistor T coupled to the data line DL4 in the block 107 can be measured via the data line DL4.

In different embodiments, different blocks are corresponding to different feed through voltages that means block 101, 103, 105 and 107 are corresponding to different feed through voltages. For the block 101 which corresponding to a feed through voltage $\Delta V_{101}$ equals an average value of the peak voltage $V_{11}$ and the peak voltage $V_{21}$. For the block 103 which corresponding to a feed through voltage $\Delta V_{103}$ equals an average value of the peak voltage $V_{31}$ and the peak voltage $V_{41}$. For the block 105 which corresponding to a feed through voltage $\Delta V_{105}$ equals an average value of the peak voltage $V_{12}$ and the peak voltage $V_{22}$. For the block 107 which corresponding to a feed through voltage $\Delta V_{107}$ equals an average value of the peak voltage $V_{32}$ and the peak voltage $V_{42}$.

Perhaps, each of the blocks can be corresponded to the same feed through voltage that means the block 101, 103, 105 and 107 are corresponding to the same feed through voltage. Meanwhile, the feed through voltage $\Delta V_{101}$, $\Delta V_{103}$, $\Delta V_{105}$ and $\Delta V_{107}$ are the same and equal to an average value of $V_{11}$, $V_{12}$, $V_{21}$, $V_{22}$, $V_{31}$, $V_{32}$, $V_{41}$ and $V_{42}$. If different blocks can correspond to different feed through voltage, each of the blocks will compensate the corresponded feed through voltage. Therefore, it will increase the effect of the voltage compensation. If different blocks correspond to the same feed through voltage, each of the blocks will compensate the same feed through voltage. Therefore, it will reduce the hardware cost of the feed through voltage compensation. The electrophoretic display uses the waveform of the driving signal to drive each pixel of the display panel, so the feed through voltage is compensated by adjusting the waveform of the driving signal. The adjustment method of the driving signal will be illustrated later.

Moreover, the operation of measuring the peak voltages of the drain voltage of the transistor T in each of the blocks can be implemented in the time that executing a array inspection. The measuring operation can be implemented by a test device that executing the array inspection so that reduces the hardware cost of measuring the feed through voltage and shorten the time of measuring the feed through voltage.

Figure 3:
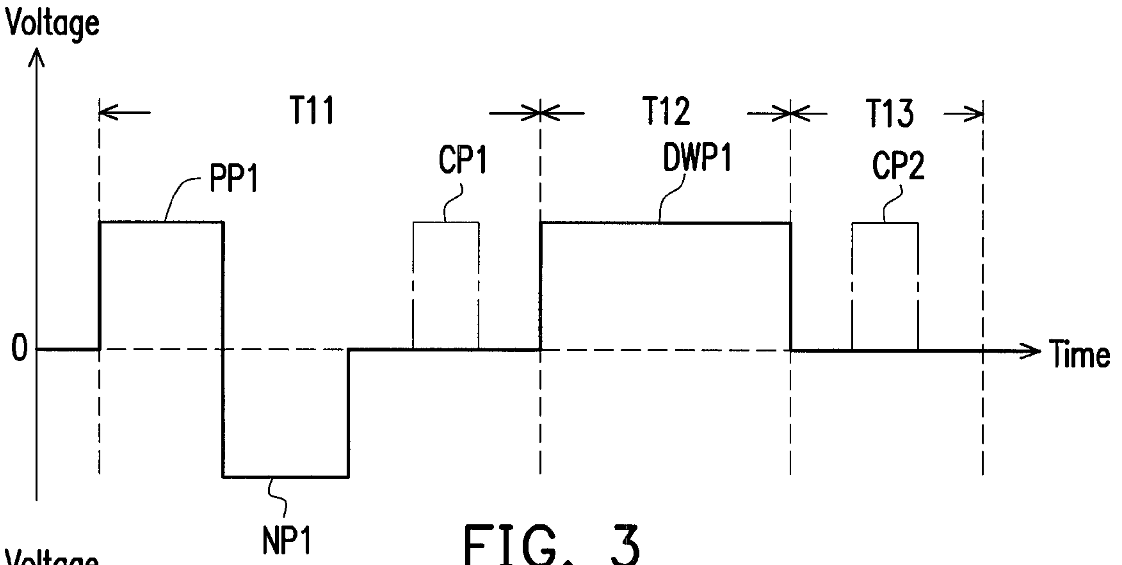
FIG. 3 is a schematic diagram of driving signal adjustment of an electrophoretic display according to an embodiment of the invention.

FIG. 3 is a schematic diagram of driving signal adjustment of an electrophoretic display according to an embodiment of the invention. Referring FIG. 1 and FIG. 3, in the embodiment, a period T11 is a reset period of the driving signal, and a period T12 is a data writing period of the driving signal. A period T13 is voltage compensation period of the driving signal in which the period T13 is selective configuration that means whether the period T13 is existed is according to the adjustment method of the driving signal of every embodiment.

In the period T11, the driving signal forms a positive pulse PP1 and a negative pulse NP1 so as to recover the charged particle to the initial position. In different embodiments, a gap can be existed between the positive pulse PP1 and the negative pulse NP1, and the waveform of the driving signal in the reset period can be designed according to the requirement of those skilled in the art. The waveform of FIG. 3 is configured to illustrate.

In the period T12, the driving signal forms a data writing pulse DWP1 which is a positive pulse. A moving distance of the charged particle is proportional to a pulse width of the data writing pulse DWP1, and the moving distance of the charged particle will effect a gray value displayed by the pixel. In different embodiments, the data writing pulse DWP1 can be formed by a plurality of positive pulses and negative pulses, and the data writing pulse DWP1 can be designed according to the requirement of those skilled in the art. The waveform of FIG. 3 is configured to illustrate.

For the data writing pulse DWP1 as depicted in FIG. 3, since the feed through voltage will reduce a voltage level of the data writing pulse DWP1 which is the positive pulse that means it will let the charged particle can't be moved to the destination, compensation pulses (as CP1 or CP2) are formed in the driving signal to compensate the moving shortage parts in which the pulse width of the compensation pulse (as CP1 or CP2) of the driving signal corresponding to each of the blocks is proportional to the feed through voltage corresponding to each of the blocks.

Moreover, the compensation pulse is formed after the positive pulse PP1 and the negative pulse NP1 which resetting the position of the charged particle, and the compensation pulse is formed before the data writing pulse (as the compensation pulse CP1) or after the data writing pulse (as the compensation pulse CP2). The compensation pulse (as CP1) can be arranged in the period T11 (as the reset period of the driving signal) and the driving signal can be neglected in the period T13 when the compensation pulse is formed before the data writing pulse (as the compensation pulse CP1). The compensation pulse (as CP1) is arranged in the period T13 (as the voltage compensation period of the driving signal) when the compensation pulse is formed after the data writing pulse (as the compensation pulse CP2).

Figure 4:
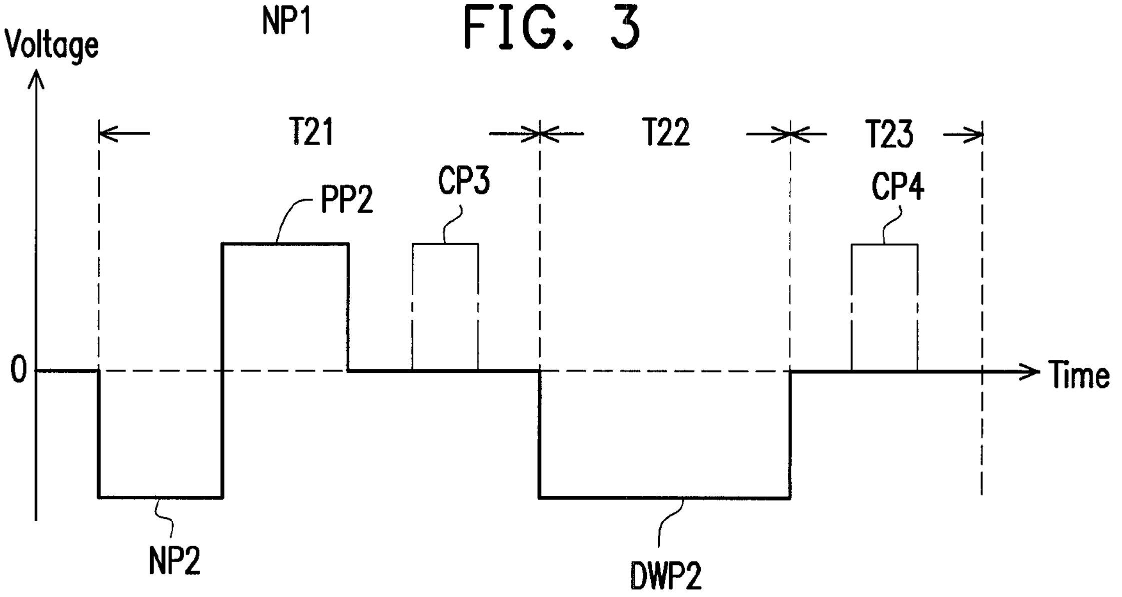
FIG. 4 is a schematic diagram of driving signal adjustment of an electrophoretic display according to another embodiment of the invention.

FIG. 4 is a schematic diagram of driving signal adjustment of an electrophoretic display according to another embodiment of the invention. Referring to FIG. 3 and FIG. 4, the differences between the two figures are that the driving signal forms a negative NP2 and a positive pulse PP2 in order in a period T21 (as the reset period of the driving signal) and a data writing pulse DWP2 is the negative pulse in a period T22 (as the data writing period of the driving signal). Since the feed through voltage will reduce the voltage level of the data writing pulse DWP2 of the negative pulse that means it will let the charged particle be moved to exceed the destination, compensation pulses (as CP3 or CP4) are formed in the driving signal to pullback the moving exceeding parts in which the pulse width of the compensation pulse (as CP3 or CP4) of the driving signal corresponding to each of the blocks is proportional to the feed through voltage corresponding to each of the blocks. In addition, the compensation pulse can be formed in the period T21 (as CP3) or in a period T23 (as CP4).

Figure 5:
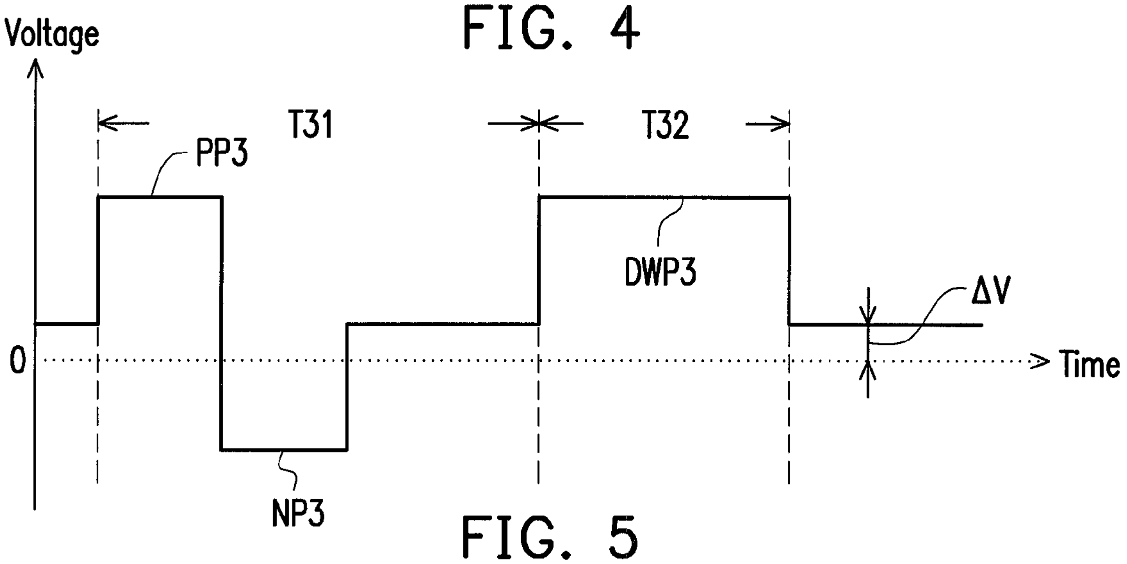
FIG. 5 is a schematic diagram of driving signal adjustment of an electrophoretic display according to another embodiment of the invention.

FIG. 5 is a schematic diagram of driving signal adjustment of an electrophoretic display according to another embodiment of the invention. Referring the FIG. 3 and FIG. 5, in the embodiment, the waveform of the driving signal is similar to the waveform in FIG. 3 (as the driving signal which doesn't include the compensation pulse CP1 and CP2). Namely, a positive pulse PP3 and negative pulse NP3 in a period T31 are similar to the positive pulse PP1 and the negative pulse NP1 in the period T11, and a data writing pulse DWP3 in a period T32 is similar to the data writing pulse DWP1 in the period T12. The difference in the embodiment is shifting the voltage level of the driving signal directly, and a voltage level offset of the driving signal corresponding to each of the blocks equals to a feed through voltage $\Delta V$ corresponding to each of the blocks. Shifting the voltage level of the driving signal can be implemented by a voltage clamping. Namely, when the pixels of each of the blocks is driven, the driving signal is clamped via a clamping circuit according to the corresponded feed through voltage and then the clamped driving signal is inputted to the pixels.

Figure 6:
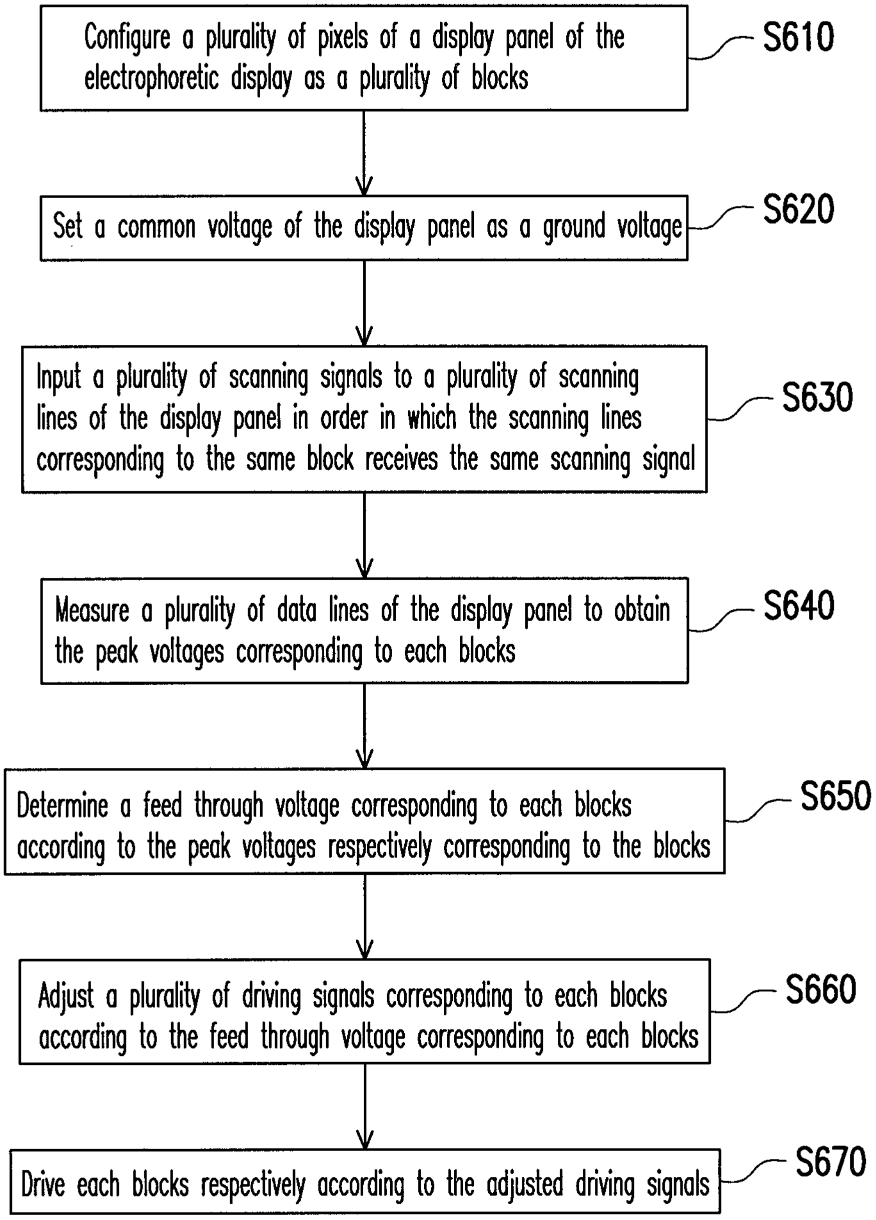
FIG. 6 is a flowchart of driving method of an electrophoretic display according to an embodiment of the invention.

According to above description, it can be collected to a driving method of an electrophoretic display. FIG. 6 is a flowchart of driving method of an electrophoretic display according to an embodiment of the invention. Referring the FIG. 6, in the driving method of the electrophoretic display, a plurality of pixels of a display panel of the electrophoretic display are configured as a plurality of blocks (step S610). Next, a common voltage of the display panel is set to a ground voltage (step S620), and a plurality of scanning signals are inputted to a plurality of scanning lines of the display panel in order in which the scanning lines corresponding to the same block receives the same scanning signal (step 630). Then, the peak voltages corresponding to each of the blocks is obtained by measuring a plurality of data lines of the display panel (step 640) and a feed through voltage corresponding to each of the blocks is determined according to the peak voltages respectively corresponding to the blocks (step 650). In addition, a plurality of driving signals corresponding to each of the blocks is adjusted according to the feed through voltage corresponding to each of the blocks (step 660). Finally, each of the blocks is driven respectively according to the adjusted driving signals(step 670). The above steps as S610, S620, S630, S640 and S650 are defined a feed through voltage measuring method of an electrophoretic display, and details of the above steps can referred explanations of above embodiments, and it is not repeated herein.

In summary, the driving method and the feed through voltage measuring method according to embodiments of the invention configure the display panel as a plurality of blocks in which pixels of the same block be turned on according to the same scanning signal, and get a peak voltage corresponding to each of the blocks by measuring data lines. Next, the feed through voltage corresponding to each of the blocks can be determined according to the peak voltages corresponding to the blocks. The driving method adjusts the waveforms of a plurality of driving signals corresponding to each of the blocks according to the feed through voltage corresponding to each of the blocks. Therefore, the feed through voltage corresponding to each of the blocks can be measured, and adjusts the waveforms of the driving signals corresponding to each of the blocks according the feed through voltage so as to compensate the feed through voltage.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A driving method of an electrophoretic display, comprising:

configuring a plurality of pixels of a display panel of the electrophoretic display as a plurality of blocks;

setting a common voltage of the display panel as a first voltage;

inputting a plurality of scanning signals to a plurality of scanning lines of the display panel in order, and not inputting a plurality of driving signals to a plurality of data lines of the display panel, wherein the scanning lines corresponding to the same block receives the same scanning signal;

measuring a plurality of data lines of the display panel to obtain at least one peak voltage corresponding to each of the blocks, wherein the peak voltages are measured from the data lines directly coupled to the scanning signals through equivalent capacitances between gates and drains of transistors within the pixels while a plurality of driving signals are not inputted to the data lines of the display panel;

determining a feed through voltage corresponding to each of the blocks according to the peak voltages respectively corresponding to the blocks;

adjusting the driving signals corresponding to each of the blocks according to the feed through voltage corresponding to each of the blocks; and driving each of the blocks respectively according to the adjusted driving signals.

2. The driving method as claimed in claim 1, wherein the blocks respectively comprises at least a pixel.

3. The driving method as claimed in claim 1, wherein the first voltage is a ground voltage.

4. The driving method as claimed in claim 1, wherein the steps to adjust the driving signals corresponding to each of the blocks according the feed through voltage corresponding to each of the blocks, comprising:

forming a compensation pulse at each of the driving signals, wherein a pulse width of the compensation pulse is proportional to the feed through voltage.

5. The driving method as claimed in claim 4, wherein the compensation pulse is formed before a data writing pulse of each of the driving signals.

6. The driving method as claimed in claim 4, wherein the compensation pulse is formed after a data writing pulse of each of the driving signals.

7. The driving method as claimed in claim 1, wherein the steps to adjust the driving signals corresponding to each of the blocks according the feed through voltage corresponding to each of the blocks, comprising:

shifting voltage levels of the driving signals, wherein voltage level offsets of the driving signals equals the feed through voltage.

8. The driving method as claimed in claim 1, wherein the feed through voltage corresponding to each of the blocks is an average value of the peak voltages corresponding to each of the blocks.

9. The driving method as claimed in claim 1, wherein the feed through voltage corresponding to each of the blocks is an average value of the peak voltages corresponding to the blocks.

10. A feed through voltage measuring method of an electrophoretic display, comprising:

configuring a plurality of pixels of a display panel of the electrophoretic display as a plurality of blocks;

setting a common voltage of the display panel as a first voltage;

inputting a plurality of scanning signals to a plurality of scanning lines of the display panel in order, wherein the scanning lines corresponding to the same block receives the same scanning signal;

measuring a plurality of data lines of the display panel to obtain at least one peak voltage corresponding to each of the blocks, wherein the peak voltages are measured from the data lines directly coupled to the scanning signals through equivalent capacitances between gates and drains of transistors within the pixels while a plurality of driving signals are not inputted to the data lines of the display panel; and determining a feed through voltage corresponding to each of the blocks according to the peak voltages respectively corresponding to the blocks.

11. The feed through voltage measuring method as claimed in claim 10, wherein the blocks respectively comprises at least a pixel.

12. The feed through voltage measuring method as claimed in claim 10, wherein the first voltage is a ground voltage.

* * * * *